US009536728B2

(12) United States Patent
Ranish et al.

(10) Patent No.: US 9,536,728 B2
(45) Date of Patent: Jan. 3, 2017

(54) LAMP FOR RAPID THERMAL PROCESSING CHAMBER

(75) Inventors: Joseph M. Ranish, San Jose, CA (US); Khurshed Sorabji, San Jose, CA (US)

(73) Assignee: Applied Material, Inc., Santa Clara, CA (US)

(*) Notice: Subject to any disclaimer, the term of this patent is extended or adjusted under 35 U.S.C. 154(b) by 1449 days.

(21) Appl. No.: 11/675,150

(22) Filed: Feb. 15, 2007

(65) Prior Publication Data

US 2008/0199163 A1    Aug. 21, 2008

(51) Int. Cl.
| A45D 20/40 | (2006.01) |
| A21B 2/00 | (2006.01) |
| H01K 1/28 | (2006.01) |
| H01K 1/32 | (2006.01) |
| H01K 1/46 | (2006.01) |
| H01K 1/58 | (2006.01) |
| H01K 7/00 | (2006.01) |
| H01L 21/67 | (2006.01) |

(52) U.S. Cl.
CPC ........ *H01K 1/28* (2013.01); *H01K 1/32* (2013.01); *H01K 1/325* (2013.01); *H01K 1/46* (2013.01); *H01K 1/58* (2013.01); *H01K 7/00* (2013.01); *H01L 21/67115* (2013.01)

(58) Field of Classification Search
None
See application file for complete search history.

(56) References Cited

U.S. PATENT DOCUMENTS

| 2,179,455 A | * | 11/1939 | Spaeth ................... 313/115 |
| 3,093,769 A | * | 6/1963 | Kuhl et al. ............. 315/46 |
| 3,588,564 A | | 6/1971 | Vetere |
| 4,074,164 A | * | 2/1978 | Leyendecker ......... 313/25 |
| 5,754,055 A | | 5/1998 | McAdoo et al. |
| 6,707,011 B2 | * | 3/2004 | Tay et al. ............... 219/411 |
| 6,744,187 B1 | * | 6/2004 | Wimberly ............. 313/110 |
| 6,805,466 B1 | | 10/2004 | Ranish |
| 7,147,359 B2 | | 12/2006 | Ranish et al. |

(Continued)

FOREIGN PATENT DOCUMENTS

| EP | 1137053 | 9/2001 |
| JP | 11214319 | 8/1999 |

(Continued)

OTHER PUBLICATIONS

"PCT International Search Report for PCT/US08/53915", (Jul. 25, 2008), 3 pgs.

(Continued)

*Primary Examiner* — Thor Campbell
(74) *Attorney, Agent, or Firm* — Servilla Whitney LLC

(57) ABSTRACT

A lamp assembly for the lamp assembly adapted for use in a substrate thermal processing chamber to heat the substrate to temperatures up to at least about 1100° C. is disclosed. In one embodiment, the lamp assembly comprises a bulb enclosing at least one radiation generating filament attached to a pair of leads, the bulb having an inner surface and an outer surface, a lamp base configured to receive the pair of leads and at least a portion of the bulb having a surface treatment adapted to reflect light away from the lamp base. In another embodiment, a sleeve covers the lamp base, which has a cross-sectional area less than about 1.2 times the cross-sectional area of the bulb.

19 Claims, 2 Drawing Sheets

(56) References Cited

U.S. PATENT DOCUMENTS

| | | |
|---|---|---|
| 7,522,822 B2* | 4/2009 | Trujillo et al. ............... 392/416 |
| 2002/0030047 A1 | 3/2002 | Shao et al. |
| 2002/0105275 A1 | 8/2002 | Shigeoka |
| 2002/0148824 A1 | 10/2002 | Hauf et al. |
| 2003/0067260 A1* | 4/2003 | Miller, Jr. .................... 313/317 |
| 2006/0038470 A1 | 2/2006 | Maul et al. |
| 2006/0066193 A1* | 3/2006 | Ranish et al. ................ 313/116 |
| 2006/0201927 A1 | 9/2006 | Gat et al. |
| 2006/0240680 A1 | 10/2006 | Yokota et al. |

FOREIGN PATENT DOCUMENTS

| | | |
|---|---|---|
| WO | WO02/03418 | 1/2002 |
| WO | WO-2004/036630 A2 | 4/2004 |

OTHER PUBLICATIONS

"PCT Written Opinion for PCT/US08/53915", (Jul. 25, 2008), 4 pgs.

Extended European Search Report in EP Appln. No. 08729823.8, dated Mar. 28, 2011, 7 pgs.

* cited by examiner

LAMP FOR RAPID THERMAL PROCESSING CHAMBER

BACKGROUND

Embodiments of the present invention generally relate to semiconductor processing systems and, more specifically, lamps for advanced heating in a semiconductor processing system.

Rapid thermal processing (RTP) systems are employed in semiconductor chip fabrication to create, chemically alter or etch surface structures on semiconductor substrates or wafers. RTP typically depends upon an array of high-intensity incandescent lamps fit into a lamphead and directed at the substrate or wafer. The lamps are electrically powered and can be very quickly turned off and on and a substantial fraction of their radiation can be directed to the substrate. As a result, the wafer can be very quickly heated without substantially heating the chamber and can be nearly as quickly cooled once the power is removed from the lamps.

An example of a RTP system is described in U.S. Pat. No. 5,155,336, which is assigned to the assignee of the present application and which is incorporated herein by reference, and includes a semiconductor processing chamber and a heat source assembly or lamphead located on the semiconductor processing chamber. A number of tungsten-halogen lamps are located in the lamphead, and the lamps are capable of heating substrates in the chamber at a rate of about 300° C./sec to temperatures as high as 1200° C. and higher. During processing, infrared radiation from the lamps radiates through an upper window, light passageways and a lower window onto a rotating semiconductor substrate in the processing chamber. In this manner, the wafer is heated to a required processing temperature.

As shown in FIG. 1, a conventional halogen lamp 10 (also referred to as a tungsten-halogen lamp) for use in semiconductor processing includes a bulb 12 (also referred to an envelope) that has a radiation generating filament in the form of a coil 14 electrically coupled between a short inner lead 16 and a long inner lead 18. Inner leads 16 and 18 are coupled to outer leads 26 by foils 22. The foils 22 are commonly made from molybdenum. The inner leads, outer leads, and foils are held in place at a lamp base 20. The lamp base is pressed together during manufacturing over the foil area to form a press seal that hermetically seals the lamp bulb. The bulb 12 is commonly made of quartz and is typically filled with a halogen containing gas.

During semiconductor processing operations, such lamps are placed in a patterned array in a processing chamber to heat a substrate placed in the chamber. The lamps operate at extremely high temperatures as noted above. Typically, about half of the radiant energy from the lamp goes out of the end of the associated light pipe after many reflections. About half of the radiant energy from the lamp is absorbed at the base 20 of the lamp and in the reflector/lamphead structure. This can cause the base of the lamp to reach much higher temperatures as compared to a lamp radiating in open space. If the base gets too hot, the average lamp lifetime can be substantially reduced. This lamp degradation is caused by rupture in the seal around the foils 22, which carry the electrical energy to the filament. Above about 300° C., the foils, which are usually made from molybdenum, are easily oxidized and the resulting molybdenum oxide causes a volume expansion which ruptures the quartz or causes an open circuit. Thus, it is necessary to provide a means for cooling the lamp base 20.

In addition, elaborate structures have been designed to conduct heat away from the lamp base 20. According to conventional methods, the lamp base 20 is encapsulated within the precision outer diameter stainless steel tube using a porous potting compound. This high precision stainless steel tube is inserted into another high precision stainless steel tube which has its outer surface (for most of its length) water cooled. A reflector sleeve which surrounds a portion of the bulb is provided to reflect radiant energy away from the bulb. This elaborate cooling mechanism causes the lamp to operate at a temperature low enough to permit long lamp life.

Another approach used to conduct heat away from the lamp is to dispose a heat shield or reflector plate within the lamp bulb between the lamp filament or coil and the lamp base. Examples of lamp bulbs that include a heat shield or internal reflector plate are disclosed in PCT International Publication No. W002/03418 and U.S. Pat. No. 6,744,187. While lamp bulbs having a heat shield or reflector plate within the bulb may be effective, these approaches require an additional part to be added to the bulb assembly.

Despite the lamp cooling approaches discussed above, it would be desirable to provide additional ways to improve heat dissipation away from the lamp, lamp base, and lamphead/reflector sleeve.

SUMMARY OF THE INVENTION

One embodiment of the present invention relates to a lamp assembly comprising a bulb enclosing at least one radiation generating filament attached to a pair of electrical connectors, the bulb having an inner surface (for interior surface), an outer surface (or exterior surface); a lamp base including the pair of electrical connectors, the lamp assembly adapted for use in a substrate thermal processing chamber to heat the substrate to temperatures up to at least about 1100° C., for example, 1350° C., at least a portion of the bulb having a surface treatment adapted to reflect or scatter light away from the lamp base. In one embodiment, the surface treatment comprises a coating on the exterior of at least a portion of the bulb comprising materials such as gold, silver, boron nitride and combinations thereof. In a specific embodiment, the coating comprises gold paint. According to an embodiment, the surface treatment covers a lower portion of the bulb. In other embodiments, the coating comprises powdered silica, alumina, zirconia or combinations thereof.

According to one or more embodiments, the surface treatment comprises a diffuse scattering component on the inner surface of a portion of the bulb. In other embodiments, the surface treatment comprises an acid treatment to impart a rough surface to the interior of the bulb, the rough surface adapted to scatter light away from the base and to minimize the movement of radiation towards the lamp base. In still other embodiments, the surface treatment comprises a layer of sintered powder material on the interior surface to scatter light away from the base and to minimize the movement of radiation towards the lamp base. The sintered powder material may comprise powdered quartz, alumina and mixtures thereof, and the sintered powder material may be mixed with a suitable binder such as a low melting point glass, for example an alkali glass such as $B_2O_3$. In one or more embodiments, the surface treatment comprises a poured internal reflecting material, such as boron nitride.

According to one or more embodiments, the lamp assembly may further comprise a sleeve enclosing the lamp base, the sleeve having a cross-sectional area that is less than about 1.2 times the cross-sectional area of the bulb. In other embodiments, the cross-sectional area of the sleeve is less than about 0.95 times the cross-sectional area of the bulb. In a specific embodiment, the cross-sectional area of the sleeve is less than about 0.42 times the cross-sectional area of the bulb. According to certain embodiments, the lamp base and the sleeve are substantially similar in cross-sectional shape.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention generally provide a lamp assembly adapted for use in a substrate thermal processing chamber to heat the substrate to temperatures up to at least about 1100° C., for example, up to about 1350° C. According to one or more embodiments, the lamp assembly, which can be used in a rapid thermal processing apparatus for use in semiconductor substrate processing, is designed to flow heat away from the bulb and to prevent radiation from flowing towards the lamp base. According to embodiments of the invention, it is expected that lamp life will be extended, and premature lamp failures will be prevented due to excessive heating of the lamp bulb and lamp base. In the following description, specific details are set forth in order to provide a thorough understanding of the invention. It will be appreciated, however, by one skilled in the art, that the invention may be practiced without these specific details. In other instances, well-known elements have not been shown in order to avoid unnecessarily obscuring the invention.

Figure 1:
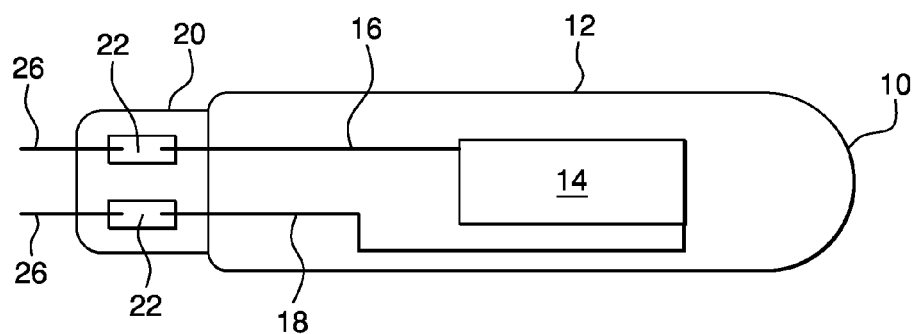
FIG. 1 shows a prior art conventional halogen lamp for use in semiconductor processing.
Figure 2:
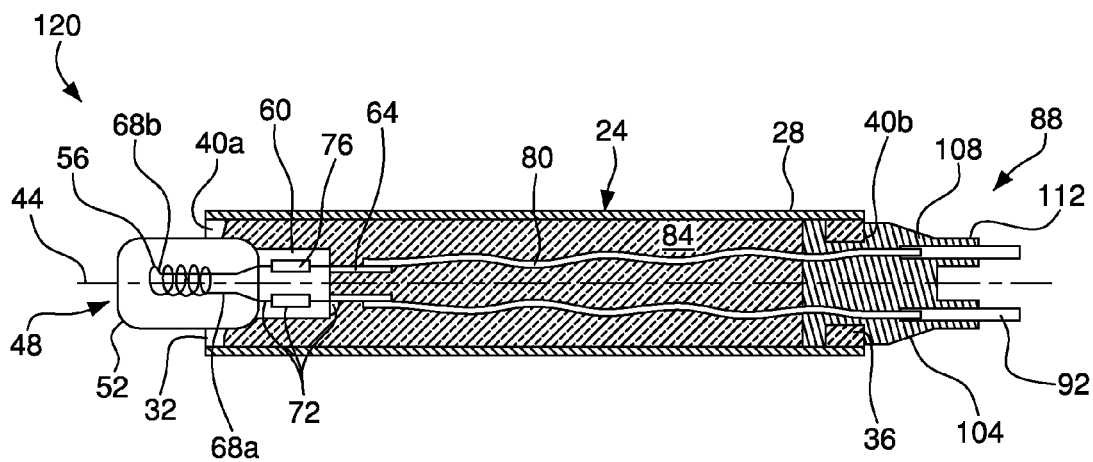
FIG. 2 shows a cross-sectional view lamp assembly according to an embodiment of the invention.

According to embodiments of the invention, surface treatments are utilized on at least a portion of the lamp bulb to scatter light away from the base and to minimize the movement of radiation towards the lamp base. Referring now to FIG. 2, an embodiment of a lamp assembly 120 that may be used to supply heat energy to process substrates in a substrate processing chamber is shown. This and other embodiments of the lamp assembly 120 described herein are only illustrative examples, however, and should not be used to limit the scope of the invention.

In one embodiment, the lamp assembly 120 comprises a sleeve or body 24 which provides a structural basis to contain the lamp assembly 120 and transfer heat out of the assembly 120. The sleeve or body 24 comprises containing walls 28 and first and second ends 32, 36. The containing walls 28 have openings 40 a,b at the first and second ends 32, 36. In one embodiment, the containing walls 28 comprise a metal that facilitates heat transfer and provides a reflective surface. For example, the sleeve 24 may comprise stainless steel, which may be brushed or polished to be reflective. In the embodiment shown, the sleeve 24 has a circular cross-section which provides ease of manufacture. However, as discussed further below other cross-sectional shapes are possible, including square, rectangular, triangular and multi-arcuate shapes. In one or more embodiments, the cross-sectional shape of the sleeve 24 substantially conforms to the shape of the lamp base. The sleeve 24 has a longitudinal axis 44 parallel to the containing walls 28 and perpendicular to the cross-section of the sleeve 24.

In one or more embodiments, the sleeve 24 may be eliminated to provide a sleeveless construction, particularly when potting compounds having an acceptable surface finish are utilized. According to one or more embodiments, a potting compound having a sufficiently smooth finish enables the use of a temporary mold, made from a material such as Teflon, to retain the shape of the potting compound in the desired form until the material has set. Such potting compounds may include filled epoxies or aluminum phosphate or silicate bonded ceramic powders.

The lamp assembly 120 shown comprises a lamp element 48 seated in the first end 32 of the sleeve or body 24. Generally, the lamp element 48 comprises a light transmissive bulb or envelope 52 that contains an internal atmosphere about a filament 56. The envelope 52 may comprise a variety of shapes, including tubular, conical, spherical, and multi-arcuate shapes. The bulb or envelope 52 also comprises a pinch seal end or lamp base 60 that allows electrical connectors 64 to pass therethrough, and may also comprise an evacuation tube (not shown) used to remove or add gases to the envelope during manufacture which is subsequently sealed. The bulb or envelope 52 comprises quartz, silica glass, aluminosilicate glass or other suitably light-transmissive materials. The internal atmosphere contained in the envelope 52 comprises, for example, a halogen containing gas. The bulb 52 and lamp base are made to withstand high temperatures and rapid temperature changes associated with semiconductor substrate rapid thermal process chambers. For example, the lamp assembly should be able to withstand the local environment resulting from processing wafers to temperatures up to at least about 1100° C., and as high as about 1350° C. and temperature changes of about 300° C./second.

The radiation generating filament 56, which is shown in the form of a coil, inside the envelope 52 of the lamp element 48 has two ends 68a,b which are electrically coupled to the electrical connectors 64. The filament 56 comprises a resistive metal wire, and in one version is a tungsten wire. The filament 56 can have single or multiple coils or coiled coils including overwound coils, or can comprise planar strips, corrugated planar strips or overwound planar strips and is coupled at its midpoints or endpoints 68a,b to the lamp element electrical connectors 64. The electrical properties of the filament 56 can be tuned by adjusting parameters such as its weight per unit length, diameter, and coiling parameters. In operation, the filament 56 can produce radiation at a wattage range of, for example, up to about 1 kW with operating voltages of about 120 $V_{AC,rms}$. Typically, the radiation is in the deep ultraviolet, ultraviolet, visible, infrared, or near infrared ranges.

The lamp element electrical connectors 64 supply power to the filament 56 from a power source outside the lamp element envelope 52 and form a continuous electrical connection between the filament 56 and a power source. The lamp element electrical connectors 64 typically comprise metal wires 72 or foils 76, or some combination thereof, with good electrical conductivity, such as molybdenum wires. The connectors 64 may also comprise other metals, such as tungsten, nickel plated steel, or any other metal with a low electrical resistance and the ability to reliably carry high currents.

The pinch seal end or lamp base 60 of the envelope 52 comprises the region where the envelope 52 is physically constricted about the electrical connectors 64 of the lamp element 48. The connectors 64 pass through and are held in place by the pinch seal end or lamp base 60 as they enter into the envelope 52 to electrically couple an external power source to the filament 56. The pinch seal end or lamp base 60 forms a hermetic seal to maintain the pressure and composition of the internal atmosphere of the envelope 52. The lamp element 48 is at least partially seated in the first end 32 of the sleeve or body 24.

The lamp assembly 120 also comprises one or more transmission wires 80 to transmit power to the lamp element 48 from the second end 36 of the lamp assembly 120. In one embodiment, the lamp assembly 120 comprises a pair of transmission wires 80, each connected to one of a pair of the electrical connectors 64 of the lamp element 48. The transmission wires 80 comprise electrically conductive wires having a relatively low electrical resistance. In one embodiment, the electrical resistance of the transmission wires 80 is no greater than about 0.1 ohms. The transmission wires 80 are electrically connected at one end to the electrical connectors 64 of the lamp element 48 by a soldered connection, a welded connection, a physical abrasion, a sonic coupling, or other type of connection in which a stable, relatively low resistance electrical connection is established. The transmission wires 80 also have an elasticity to allow for their movement and bending. For example, in one version, the transmission wires 80 have a Young's Modulus of about 30 GPa to about 130 GPa. This allows the transmission wires 80 to bend and be manipulated during assembly and operation of the lamp assembly, but also allows them to retain a sufficient amount of rigidity to hold their shape.

The lamp assembly 120 comprises a potting compound 84 inside the sleeve or body 24 which promotes heat transfer between the heat generating elements of the lamp assembly 120 and the sleeve or body 24. The heat generating elements can include, for example, the lamp element 48 and the transmission wires 80. The potting compound 84 transfers heat energy to the sleeve or body 24 which can then transfer the heat out of the lamp assembly 120. In one embodiment, the potting compound 84 is at least between the pinch seal end or lamp base 60 of the lamp element 48 and the containing wall 28 of the sleeve or body 24. For example, the potting compound 84 can be substantially about the entire pinch seal end or lamp base 60 and extend all the way to the containing wall 28. The potting compound 84 can also extend beyond the pinch seal end or lamp base 60 of the lamp element 48, for example, in one embodiment, the potting compound 84 extends towards the second end 36 of the sleeve or body 24. In one embodiment, the potting compound 84 extends to about 90% of the total length of the sleeve or body 24.

The potting compound 84 comprises a material with a sufficient thermal conductivity to effectively transfer heat. For example, in one embodiment, the potting compound 84 comprises a material with a thermal conductivity of about 1 W/(K-m) to about 1.6 W/(K-m). The potting compound 84 is heated during manufacture of the lamp assembly 120 to remove or reduce its water content. For example, in one embodiment, after heating, the potting compound 84 comprises a water content of no more than 0.1% by weight. The remaining water content is generally releasable during lamp operation. The potting compound 84 is also sufficiently malleable to facilitate its integration into the lamp assembly 120 in thermally continuous regions. In one embodiment, the potting compound 84 comprises a magnesium phosphate bonded zirconium silicate, which is advantageous because it conforms very well to the lamp element 48, for example the envelope 52 and the pinch seal end or lamp base 60, without bonding so tightly such that stresses are created in the lamp envelope 52 or pinch seal end or lamp base 60. In another embodiment, the potting material 84 comprises an aluminum phosphate bonded silica, zirconia, aluminum nitride, or alumina filler. In another embodiment, the potting material 84 comprises an alkali silicate bonded silica, alumina, or zirconia filler.

The lamp assembly 120 comprises a plug 88 positioned at the second end 36 of the sleeve or body 24. The plug makes connection with the external power supply and accommodates any misalignment between the lamphead and the external electrical connectors. The plug 88 may be made of rigid material or elastomeric material. Furthermore, the plug may be fixed with respect or inserted into to the end 36 of the sleeve or body 24 as shown, or it may be flexibly position with respect to the end 36. When the plug 88 is flexibly positioned, the plug is capable of movement relative to the second end 36 of the sleeve or body 24 in a direction perpendicular to the longitudinal axis 44. While flexibly positioning the plug 88 may have certain advantages, for ease of manufacturing, it may be desirable to fix an elastomeric plug 88 to the end 36 of the sleeve or body 24. The plug 88 has electrical connectors 92 which transfer electrical power to the transmission wires 80. The plug 88 comprises materials that can withstand the temperatures required to remove water content from the potting compound 84. In one embodiment, the plug material is capable of withstanding exposure to at least about 165° C. for at least about 15 hours. The plug may be made of rigid materials or flexible materials. Rigid materials typically allow for exposure of the plug 88 to higher temperatures for a longer time than flexible materials. While flexible materials, such as elastomers, for example, generally do not withstand exposure to relatively high temperatures as well as rigid materials because the weaker internal bonding required for flexibility also generally results in lower thermal stability, but they may be used in accordance with embodiments of the invention. For example, Santoprene 201-64, an elastomer material used in flexible plugs, can withstand about 150° C. for about 15 hours before its flexibility and other properties begin to degrade.

The plug 88 can also comprises a pair of electrical connectors 92 that are shaped to mate with the receiving receptacle in the substrate processing chamber and are electrically connected to the transmission wires 80. The electrical connectors 92 transfer power from the receptacle to the transmission wires 80, which in turn transfer power to the lamp element 48. The plug electrical connectors 92 comprise an electrically conductive material such as a metal. For example, in one version the connectors 92 comprise iron alloys, nickel, or copper, or mixtures thereof. In one version, the connectors 92 may comprise a combination of materials in which one material is plated or deposited onto another material.

The plug 88 comprises a first plug element 104 which provides a structural basis for holding the plug electrical connectors 92 and receiving the lamp assembly transmission wires 80. The first plug element 104 is not shown as directly attached to the body 24 of the lamp assembly 120, but in one or more embodiments, the plug may be attached to the sleeve or body 24. The first plug element 104 has a main body 108 to receive and at least partially encapsulate the plug electrical connectors 92 and the transmission wires 80. The plug element 104 may also have extensions 112 that further support plug electrical connectors 92 that may be relatively large in size as well as provide additional insulation for high voltage operation. Other variations on the shape and size of the first plug element 104 are also possible.

Figure 3:
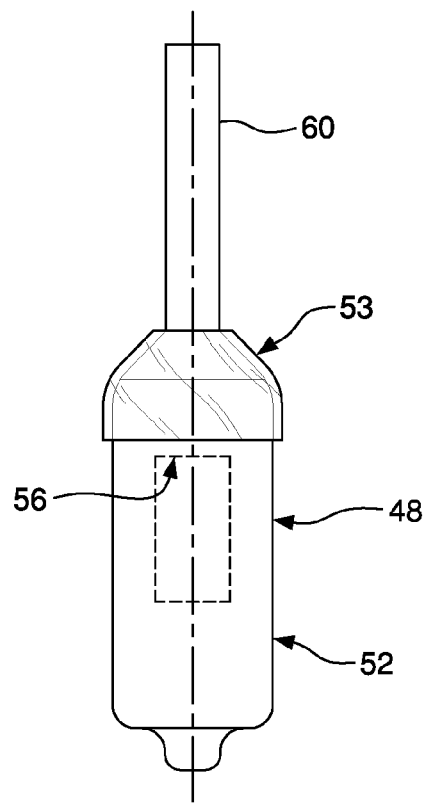
FIG. 3 shows a lamp bulb and lamp base according to an embodiment of the invention.

Referring now to FIG. 3, the lamp element 48 shown in FIG. 2 is shown removed from the lamp assembly 120. The lamp elements comprises a light transmissive bulb or envelope 52 that contains an internal atmosphere about a filament 56, shown in phantom, and the pinch seal end or lamp base 60. As shown in FIG. 3, a surface treatment 53 is shown on the lower portion of the bulb or envelope 52. The surface treatment 53 is shown as being on the exterior of the bulb or envelope 52, however, the surface treatment could be on the interior lower portion of the bulb or envelope 52. The surface treatment 53 can extend a suitable distance from the lamp base or pinch seal end or lamp base 60. In one or more embodiments, the surface treatment 53 extends at least about 10% of the axial length of the bulb 52 from the lamp base 60. In other embodiments, the surface treatment extends at least about 20%, 30% or 40% of the axial length of the bulb from the lamp base.

In one embodiment, the surface treatment comprises a coating on the exterior of at least a portion of the lamp base. The coating can be any suitable coating such as gold, silver, boron nitride and combinations thereof. In a specific embodiment, the coating comprises gold paint. Other suitable coatings include Corr-Paint™ 20xx series protective coatings available from Aremco, Simoniz Sperex high temperature paints available from Holts, and INSL-X Hi-Temp #AL-2402 available from Hy-Tech Thermal Solutions. The coating may also comprise a powdered material such as silica, alumina, zirconia, and combinations of these materials. In other embodiments, the reflective coating could be applied by vapor deposition methods such as physical or chemical vapor deposition.

According to one or more embodiments, the surface treatment comprises a diffuse scattering component on the inner surface of a portion of the bulb. The diffuse scattering component can be part of the interior surface that has been treated to provide a roughened surface that will scatter light. For example, the surface treatment could comprise an acid treatment to impart a rough surface to the interior of the bulb, the rough surface adapted to scatter light away from the base and to minimize the movement of radiation towards the lamp base. In other embodiments, the surface treatment comprises a layer of sintered powder material on the interior surface to scatter light away from the base and to minimize the movement of radiation towards the lamp base. The sintered powder material may comprise powdered quartz, alumina and mixtures thereof, and the sintered powder material may be mixed with a suitable binder such as a low melting point glass, for example, an alkali glass such as $B_2O_3$. In one or more embodiments, the surface treatment comprises a poured internal reflecting material, such as boron nitride. Other surface treatments to the interior and exterior of the bulb are within the scope of the invention, provided they scatter light away from the base of the lamp and minimize the flow of radiation towards the lamp base. According to embodiments of the invention, surface treatments on the exterior and/or the interior of the lamp bulb direct radiation from the coil away from the lamp base, maintaining the base and press seal at a lower operating temperature, which is expected to provide a longer lamp life.

In conventional lamp assemblies, the sleeve or body shown in FIG. 2 has a diameter that is substantially larger in cross-sectional area than that of the lamp bulb or envelope 52. In a conventional lamp assembly, the sleeve or tube has an outer diameter measuring 0.619 inches, while the bulb has a maximum of about 0.457 inches in outer diameter. Thus, the ratio of the area of the sleeve or tube is at least about 1.85 times the cross-sectional area of the bulb.

It has been determined that by substantially decreasing the cross-sectional area of the sleeve or tube, the flow of heat from the lamp base can be improved, maintaining the lamp base and the bulb at a lower temperature. In exemplary embodiments, the sleeve has a cross-sectional area that is less than about 1.2 times the cross-sectional area of the bulb. In other embodiments, the cross-sectional area of the sleeve is less than about 0.95 times the cross-sectional area of the bulb. In a specific embodiment, the cross-sectional area of the sleeve is less than about 0.42 times the cross-sectional area of the bulb.

Figure 4:
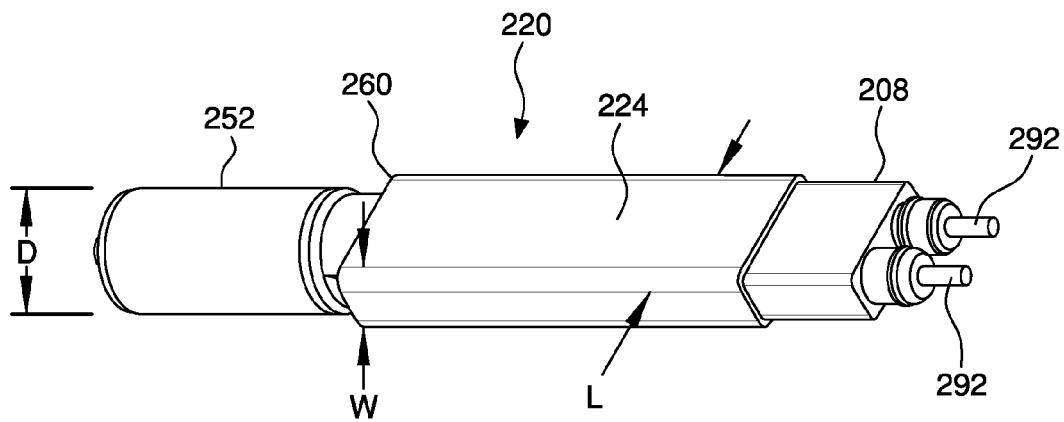
FIG. 4 shows a perspective view of a lamp assembly according to an embodiment of the invention.

The skilled artisan will appreciate the ratio of the area of the bulb to the area of the tube can be easily calculated depending on the cross-sectional shape of the parts. According to certain embodiments, the lamp base and the sleeve are substantially similar in cross-sectional shape. Referring now to FIG. 4, a lamp assembly 220 is shown, in which sleeve 224 is substantially rectangular in cross-sectional shape, which conforms the cross-sectional shape of the lamp base 260 and plug 208, which has connectors 292 extending therefrom. The bulb or envelope 252 is substantially circular in cross-section. In an exemplary embodiment, the lamp bulb or envelope 252 outer diameter D is 0.457 inches maximum and the cross-sectional area is 0.164 square inches. The sleeve 224 can have a length L of 0.571 and a width W of 0.270, with a resulting cross-sectional area of 0.154 square inches. Thus, the ratio of the cross-sectional area of the sleeve 224 to the bulb cross-sectional area is less than about 0.95. As noted above, it is desirable for the ratio of the cross-sectional area of the sleeve to the bulb to be less than about 1.20, and according to some embodiments, the ratio can be as low as about less than about 0.42.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

It is to be understood that the above description is intended to be illustrative, and not restrictive. Many other embodiments will be apparent to those of ordinary skill in the art upon reviewing the above description. The scope of the invention should, therefore, be determined with reference to the appended claims, along with the full scope of equivalents to which such claims are entitled.

The invention claimed is:

1. A lamp assembly for use in rapidly heating a substrate in a thermal processing chamber comprising:
   a quartz bulb enclosing at least one radiation generating filament attached to a pair of electrical connectors, the bulb having an interior surface containing a halogen gas and an exterior surface;

a lamp base including the pair of electrical connectors, at least a portion of the bulb having a surface treatment extending from the lamp base on a lower portion of the bulb comprising a diffuse scattering component on the interior surface, such that when the lamp assembly is placed in an array to rapidly heat the substrate to temperatures up to at least 1100° C., the coating minimizes movement of radiation towards the lamp base and the bulb can withstand rapid temperature changes in the rapid thermal processing chamber.

2. The lamp assembly of claim 1, wherein the surface treatment further comprises a coating on the exterior surface of at least the lower portion of the bulb, the coating selected from the group consisting of aluminum, gold, silver, boron nitride, and combinations thereof.

3. The lamp assembly of claim 2, wherein the coating comprises high temperature paint.

4. The lamp assembly of claim 1, wherein the surface treatment comprises a coating selected from the group consisting of powdered silica, alumina, zircon, and combinations thereof.

5. The lamp assembly of claim 1, wherein the surface treatment comprises an acid treatment to impart a rough surface to the interior surface of the bulb, the rough surface adapted to scatter light away from the base and to minimize the movement of radiation towards the lamp base.

6. The lamp assembly of claim 1, wherein the surface treatment comprises a layer of sintered powder material on the interior surface to scatter light away from the base and to minimize the movement of radiation towards the lamp base.

7. The lamp assembly of claim 6, wherein the sintered powder material comprises powdered quartz, alumina, or mixtures thereof.

8. The lamp assembly of claim 7, wherein the sintered powder material is mixed with a binder.

9. The lamp assembly of claim 1, wherein the surface treatment comprises a poured internal reflecting material.

10. The lamp assembly of claim 1, further comprising a sleeve enclosing the lamp base, the sleeve having a cross-sectional area that is less than 1.2 times the cross-sectional area of the bulb.

11. The lamp assembly of claim 10, wherein the cross-sectional area of the sleeve is less than 0.95 times the cross-sectional area of the bulb and the lamp base and the sleeve are substantially similar in cross-sectional shape.

12. The lamp assembly of claim 10, wherein the cross-sectional area of the sleeve is less than 0.42 times the cross-sectional area of the bulb.

13. The lamp assembly of claim 1, the assembly is sleeveless in construction.

14. A lamp assembly for rapid thermal processing comprising:
a quartz bulb enclosing at least one coil attached to a pair electrical connectors, the bulb having an inner surface containing a halogen gas and an outer surface;
a lamp base including the pair of electrical connectors; and
a sleeve surrounding the lamp base, the sleeve having a cross-sectional area that is less than 0.95 times the cross-sectional area of the bulb, the lamp assembly adapted for use in a substrate thermal processing chamber to heat the substrate to temperatures up to at least 1100° C.

15. The lamp assembly of claim 14 further comprising a reflective coating extending from the lamp base on at least a portion of the bulb.

16. The lamp assembly of claim 15, wherein the reflective coating is located on the exterior surface of at least a lower portion of the bulb, the coating being selected from the group consisting of gold, silver, boron nitride, powdered silica, powdered alumina, powdered zirconia and combinations thereof.

17. The lamp assembly of claim 14, further comprising a diffuse scattering component extending from the lamp base on the interior surface of the bulb.

18. The lamp assembly of claim 17, wherein the diffuse scattering component comprises a roughened surface.

19. The lamp assembly of claim 17, wherein the diffuse scattering component comprises a sintered powder selected from boron nitride, silver, silica, zirconia, alumina and combinations thereof.

* * * * *

UNITED STATES PATENT AND TRADEMARK OFFICE
CERTIFICATE OF CORRECTION

PATENT NO. : 9,536,728 B2
APPLICATION NO. : 11/675150
DATED : January 3, 2017
INVENTOR(S) : Joseph M. Ranish et al.

It is certified that error appears in the above-identified patent and that said Letters Patent is hereby corrected as shown below:

In the Claims

In Claim 1, Column 8, Line 62:
"in a thermal processing chamber" should read --in a rapid thermal processing chamber--

In Claim 1, Column 9, Line 7:
"the coating" should read --the surface treatment--

In Claim 5, Column 9, Line 25:
"away from the base" should read --away from the lamp base--

In Claim 13, Column 10, Line 8:
"claim 1, the assembly" should read --claim 1, wherein the assembly--

In Claim 14, Column 10, Line 13:
"electrical connectors" should read --of electrical connectors--

In Claim 16, Column 10, Line 28:
"the coating being" should read --the reflective coating being--

In Claim 17, Column 10, Line 14:
"on the interior surface of teh bulb" should read --on the inner surface of the bulb--

Signed and Sealed this
Sixteenth Day of January, 2018

Joseph Matal
*Performing the Functions and Duties of the
Under Secretary of Commerce for Intellectual Property and
Director of the United States Patent and Trademark Office*